(12) United States Patent
Wang et al.

(10) Patent No.: US 12,469,769 B2
(45) Date of Patent: Nov. 11, 2025

(54) ELECTRONIC PACKAGING STRUCTURE AND MANUFACTURING METHOD THEREOF

(71) Applicant: Unimicron Technology Corp., Taoyuan (TW)

(72) Inventors: Chin-Sheng Wang, Taoyuan (TW); Ra-Min Tain, Hsinchu County (TW); Chih-Kai Chan, Taoyuan (TW); Jun-Ho Chen, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 259 days.

(21) Appl. No.: 18/337,438

(22) Filed: Jun. 20, 2023

(65) Prior Publication Data
US 2023/0335466 A1    Oct. 19, 2023

Related U.S. Application Data

(63) Continuation-in-part of application No. 17/890,279, filed on Aug. 18, 2022.
(Continued)

(30) Foreign Application Priority Data

Jul. 21, 2022  (TW) .................................. 111127319
Apr. 17, 2023  (TW) .................................. 112114187

(51) Int. Cl.
*H05K 1/18*    (2006.01)
*H01L 23/48*   (2006.01)
(Continued)

(52) U.S. Cl.
CPC ............ *H01L 23/481* (2013.01); *H01L 23/66* (2013.01); *H05K 1/0216* (2013.01); *H05K 1/189* (2013.01);
(Continued)

(58) Field of Classification Search
CPC ...... H05K 1/183; H05K 1/189; H05K 1/0216; H05K 3/4691; H05K 3/4697
See application file for complete search history.

(56) References Cited

U.S. PATENT DOCUMENTS 7,053,314 B1 *  5/2006  Camerlo ................ H05K 1/141
                                            174/262
7,408,120 B2 *  8/2008  Kim ...................... H05K 1/115
                                            174/265
(Continued)

FOREIGN PATENT DOCUMENTS

TW    200950043    12/2009
TW    201631701    9/2016
(Continued)

OTHER PUBLICATIONS

"Office Action of Taiwan Related Application, Application No. 111127319", issued on Oct. 12, 2023, p. 1-p. 6.
"Office Action of Taiwan Counterpart Application", issued on Jan. 11, 2024, p. 1-p. 4.

*Primary Examiner* — Jeremy C Norris
(74) *Attorney, Agent, or Firm* — JCIPRNET

(57) ABSTRACT

An electronic packaging structure including a first circuit structure, a second circuit structure and at least one electronic device is provided. The bottom side of the first circuit structure has at least one cavity. The first circuit structure is disposed on the second circuit structure. The first circuit structure and the second circuit structure are electrically connected to each other. The electronic device is disposed on the second circuit structure. The electronic device is disposed corresponding to the cavity of the first circuit structure.

18 Claims, 16 Drawing Sheets

Related U.S. Application Data

(60) Provisional application No. 63/425,313, filed on Nov. 15, 2022, provisional application No. 63/311,449, filed on Feb. 18, 2022.

(51) Int. Cl.
    *H01L 23/66* (2006.01)
    *H05K 1/02* (2006.01)
    *H05K 3/46* (2006.01)

(52) U.S. Cl.
    CPC ......... *H05K 3/4691* (2013.01); *H05K 3/4697* (2013.01); *H01L 2223/6677* (2013.01); *H05K 2201/0154* (2013.01); *H05K 2201/09809* (2013.01); *H05K 2201/10098* (2013.01)

(56) References Cited

U.S. PATENT DOCUMENTS

| | | | |
|---|---|---|---|
| 2013/0105987 A1* | 5/2013 | Gallegos | H05K 1/0222 257/E21.586 |
| 2013/0180104 A1* | 7/2013 | Moul | H01P 11/003 29/846 |
| 2015/0014031 A1* | 1/2015 | Lin | H05K 3/4697 174/266 |
| 2022/0399307 A1 | 12/2022 | Marin et al. | |

FOREIGN PATENT DOCUMENTS

| | | |
|---|---|---|
| TW | 201901864 | 1/2019 |
| TW | 202135262 | 9/2021 |
| TW | 202207399 | 2/2022 |

* cited by examiner

ELECTRONIC PACKAGING STRUCTURE AND MANUFACTURING METHOD THEREOF

CROSS-REFERENCE TO RELATED APPLICATION

This application is a continuation-in-part application of and claims the priority benefit of U.S. application Ser. No. 17/890,279, filed on Aug. 18, 2022. The prior U.S. application Ser. No. 17/890,279 claims the priority benefits of U.S. provisional application Ser. No. 63/311,449, filed on Feb. 18, 2022, and Taiwan application serial no. 111127319, filed on Jul. 21, 2022. This application also claims the priority benefit of U.S. provisional application Ser. No. 63/425,313, filed on Nov. 15, 2022, and Taiwan application serial no. 112114187, filed on Apr. 17, 2023. The entirety of each of the above-mentioned patent applications is hereby incorporated by reference herein and made a part of this specification.

BACKGROUND

Technical Field

The disclosure relates to a package structure and a manufacturing method thereof, and in particular relates to an electronic packaging structure with an electronic device disposed between a plurality of circuit structures and manufacturing method thereof.

Description of Related Art

With the advancement of technology, the functions of electronic products are becoming more and more abundant, and we are also increasingly dependent on electronic mobile devices. In response to the demands of miniaturization and weight reduction of electronic products, the integration of the antenna structure and the chip package structure contributes to the miniaturization and weight reduction of electronic products. Generally speaking, for the current chip package structure with antenna structure, the chip is usually disposed on the circuit board, and the chip is covered by a film sealing material to form the chip package structure. The antenna structure is disposed on the chip package structure, and the antenna structure is electrically connected to the circuit board through a conductive pillar or a conductive ball penetrating the film sealing material in the chip package structure. However, in the above-mentioned packaging structure, an electronic device (e.g., the chip) may be difficult to be protected well; and/or, the above-mentioned packaging structure may be difficult to reduce the signal divergence effectively during radio frequency transmission, and may have a larger size.

SUMMARY

The disclosure provides an electronic package structure and a manufacturing method thereof.

An electronic packaging structure of the disclosure includes a first circuit structure, a second circuit structure and at least one electronic device is provided. The bottom side of the first circuit structure has at least one cavity. The first circuit structure is disposed on the second circuit structure. The first circuit structure and the second circuit structure are electrically connected to each other. The electronic device is disposed on the second circuit structure. The electronic device is disposed corresponding to the cavity of the first circuit structure.

In an embodiment of the disclosure, an inner surface of the cavity of the first circuit structure is covered with a conductive material.

In an embodiment of the disclosure, the conductive material covered on the inner surface of the cavity of the first circuit structure is electrically grounded.

In an embodiment of the disclosure, the first circuit structure comprises at least one coaxial conductive through via. The coaxial conductive through via includes an inner conductive layer, an outer conductive layer, and a first dielectric layer. The first dielectric layer is disposed between the inner conductive layer and the outer conductive layer.

In an embodiment of the disclosure, a material of the outer conductive layer of the coaxial conductive through via includes copper.

In an embodiment of the disclosure, a material of the first dielectric layer of the coaxial conductive through via includes resin.

In an embodiment of the disclosure, the first circuit structure further includes an upper conductive layer and a lower conductive layer. Two ends of the outer conductive layer of the one coaxial conductive through via are respectively connected to a portion of the upper conductive layer and a portion of the lower conductive layer.

In an embodiment of the disclosure, the inner conductive layer of the coaxial conductive through via is electrically connected to outermost circuits on both sides of the first circuit structure.

In an embodiment of the disclosure, the coaxial conductive through via further includes a second dielectric layer. The inner conductive layer is disposed between the first dielectric layer and the second dielectric layer.

In an embodiment of the disclosure, the first circuit structure further includes an antenna. The antenna is at least a portion of an outermost circuit layer of the first circuit structure. The electronic device is electrically connected to the antenna through the inner conductive layer of the coaxial conductive through via. An inner surface of the cavity of the first circuit structure is covered with a conductive material. The conductive material covered on the inner surface of the cavity and the outer conductive layer of the coaxial conductive through via are electrically grounded.

In an embodiment of the disclosure, at least one of the first circuit structure or the second circuit structure comprises a solder resist layer disposed on an outermost thereof.

In an embodiment of the disclosure, the electronic packaging structure further includes a filling material. The filling material is disposed between the first circuit structure and the second circuit structure.

In an embodiment of the disclosure, the electronic packaging structure further includes a conductive connector. The conductive connector is disposed between the first circuit structure and the second circuit structure to electrically connect the first circuit structure and the second circuit structure.

In an embodiment of the disclosure, the electronic packaging structure further includes a conductive connector. The conductive connector is disposed between the electronic device and the second circuit structure to electrically connect the electronic device and the second circuit structure.

A manufacturing method of an electronic packaging structure of the disclosure includes the following steps: providing a first circuit structure, having at least one cavity on a bottom side thereof; providing a second circuit structure; disposing at least one electronic device on the second circuit structure; and disposing the first circuit structure on the second circuit structure with the electronic device disposed thereon, wherein the first circuit structure and the second circuit structure are electrically connected to each other, and the electronic device is disposed corresponding to the cavity of the first circuit structure.

In the electronic packaging structure of the disclosure, the electronic device is disposed between the first circuit structure and the second circuit structure, and at least a portion of the electronic device may be disposed within the cavity of the first circuit structure. In this way, the electronic devices may have a better protection, which may reduce the possibility of damage or failure of the electronic device, and thus improve the quality of the electronic packaging structure.

Additionally, the first circuit structure of the electronic packaging structure may further include a coaxial conductive via. The electronic device may be electrically connected to a corresponding circuit (e.g., an antenna) through the coaxial conductive via (e.g., through the inner conductive layer of the coaxial conductive via). In this way, signal interference may be reduced and/or signal quality may be improved or better.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
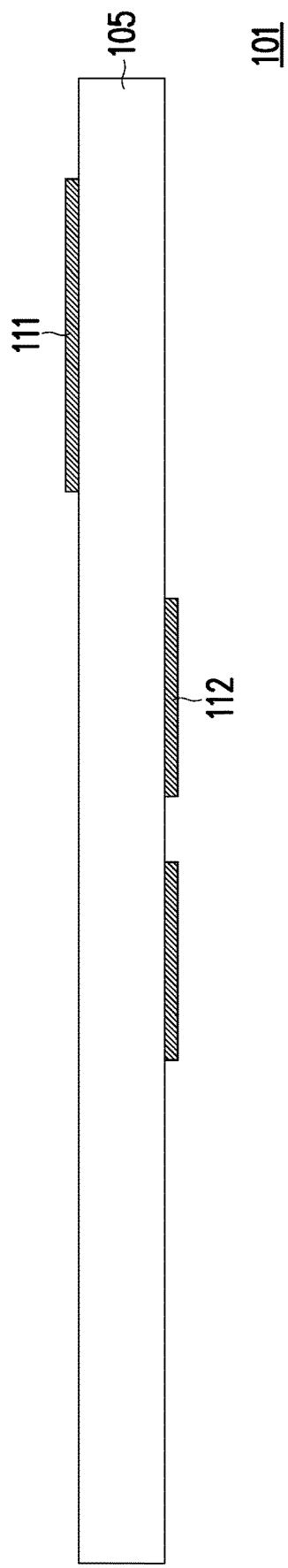
FIG. 1A to FIG. 1P are partial schematic drawings of a partial manufacturing method for an electronic packaging structure according to a first embodiment of the disclosure.

The following examples are described in detail with the accompanying drawings, but the provided examples are not intended to limit the scope of the disclosure. In addition, the drawings are for illustrative purposes only and are not drawn in full scale. In order to facilitate understanding, the same elements in the following description are described with the same symbols.

In addition, the terms such as "including", "comprising", "having", etc. used in the text are all open-ended terms, that is, "including but not limited to".

It should be understood that, although the terms "first", "second", "third", or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion. Thus, "a first element," "component," "region," "layer," or "portion" discussed below may be referred to as a second element, component, region, layer, or portion without departing from the teachings herein.

In the disclosure, wordings used to indicate directions, such as "up," "down," "top," and "bottom," merely refer to directions in the accompanying drawings. Therefore, the directional terms are used to illustrate rather than limit the disclosure.

The term "approximately," "similar," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system), the process in question and the error associated with process of the particular quantity (i.e., the limitations of the process system), or the installation in question and the error associated with installation of the particular quantity (i.e., the limitations of the installation method). For instance, "about" may mean within one or more standard deviations, or within, for example, ±30%, ±20%, ±10%, or ±5% of the stated value. Moreover, a relatively acceptable range of deviation or standard deviation may be chosen for the term "approximately," "similar," or "substantially" as used herein based on optical properties, etching properties, installation methods, visual perception or other properties, instead of applying one standard deviation across all the properties.

In the accompanying drawings, the drawings illustrate the general features of the methods, structures, and/or materials used in the particular embodiments. However, the drawings shall not be interpreted as defining or limiting the scope or nature covered by the embodiments. For example, the relative sizes, thicknesses, and locations of the layers, regions, and/or structures may be reduced or enlarged for clarity.

In the following embodiments, the same or similar elements will be designated by the same or similar reference numerals, and descriptions thereof will be omitted. In addition, the features of different embodiments may be combined with each other when they are not in conflict, and simple equivalent changes and modifications made according to the specification or the claims are still within the scope of the disclosure.

<First Circuit Structure>

Figure 1B:
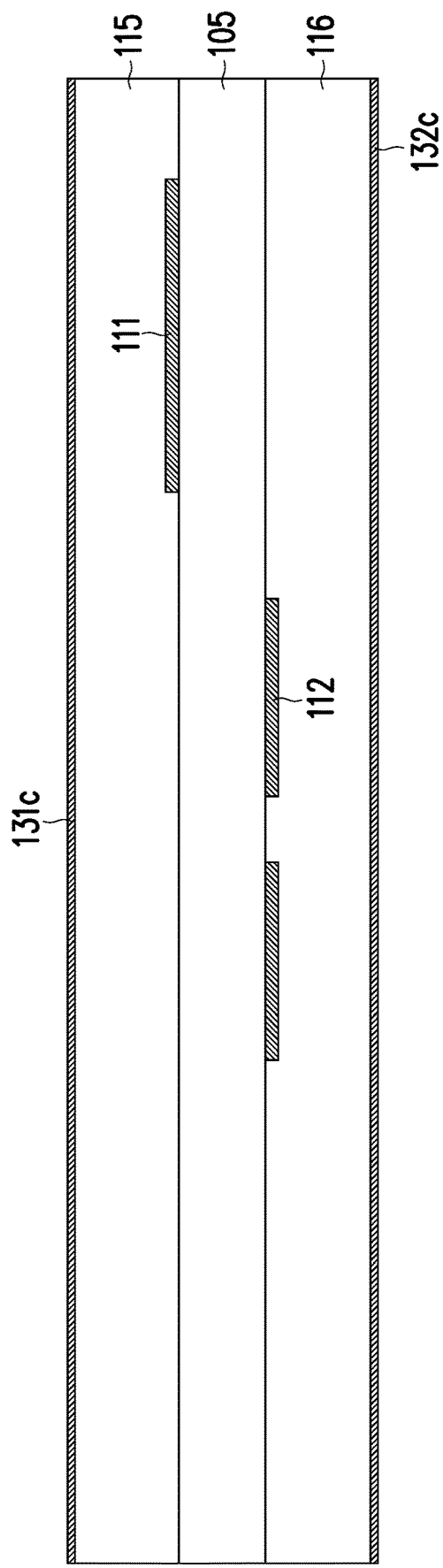
Figure 1C:
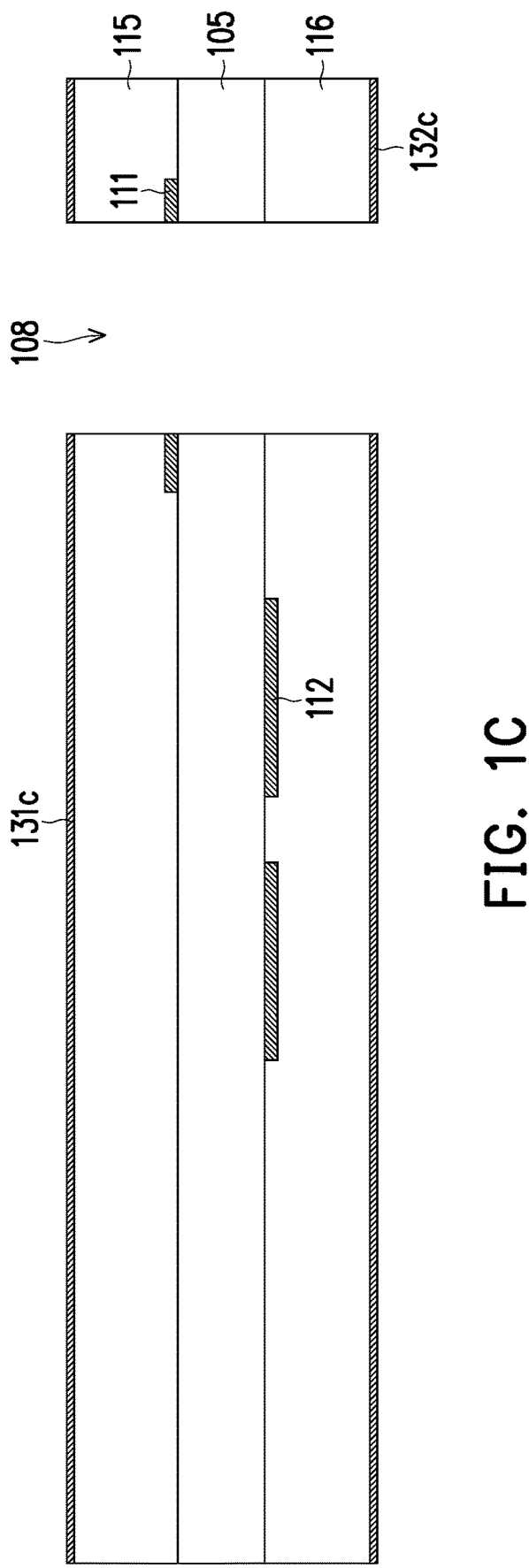
Figure 1D:
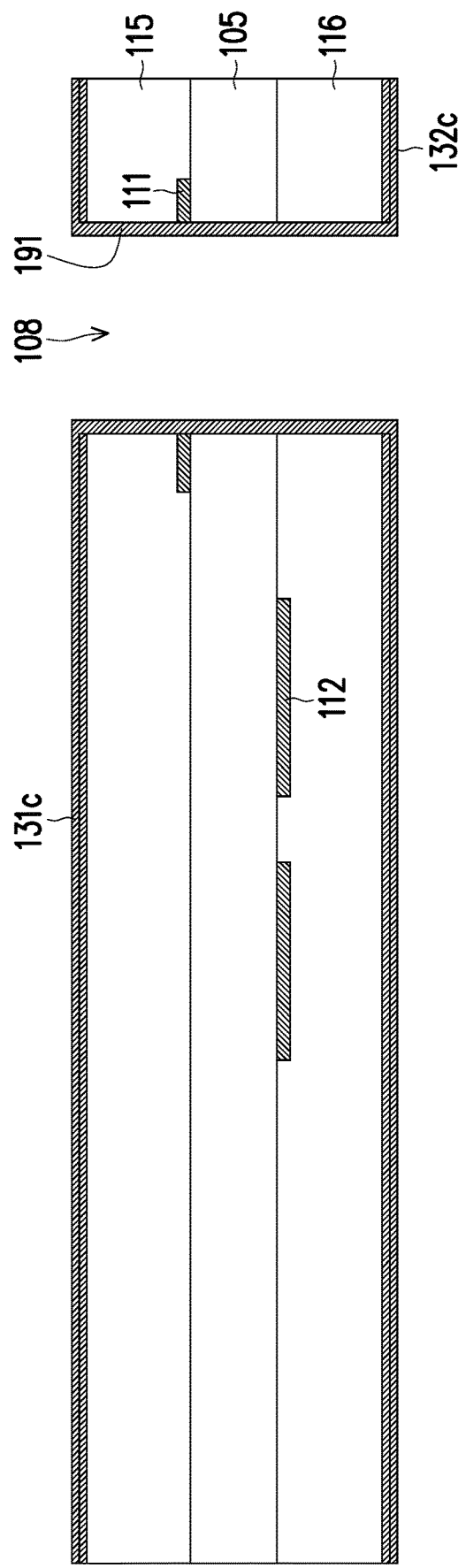
Figure 1E:
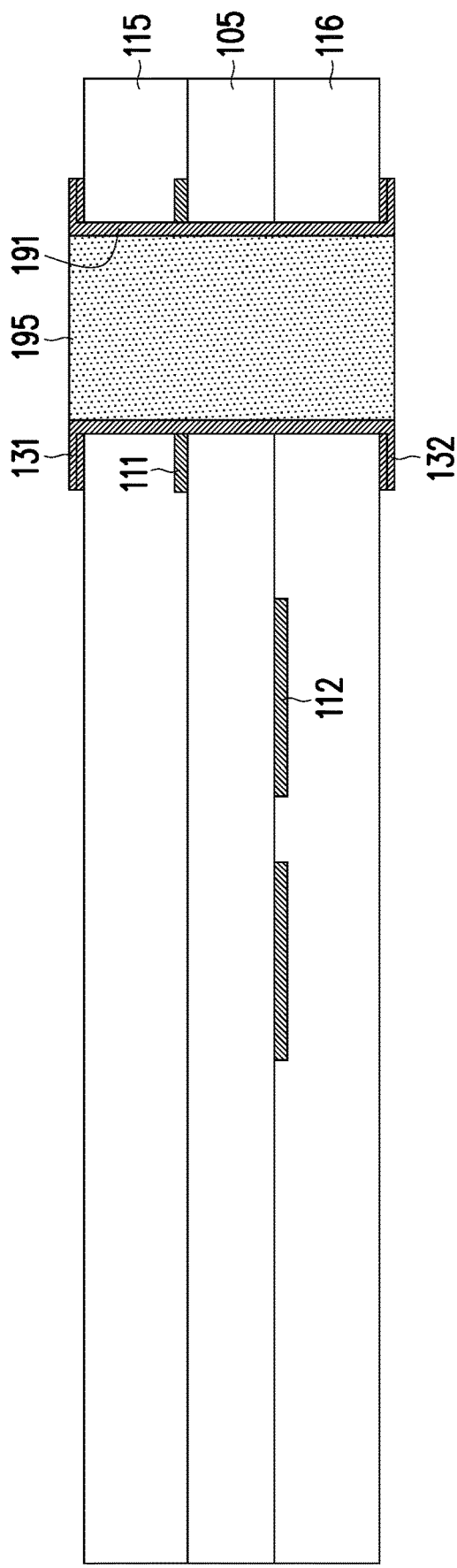
Figure 1F:
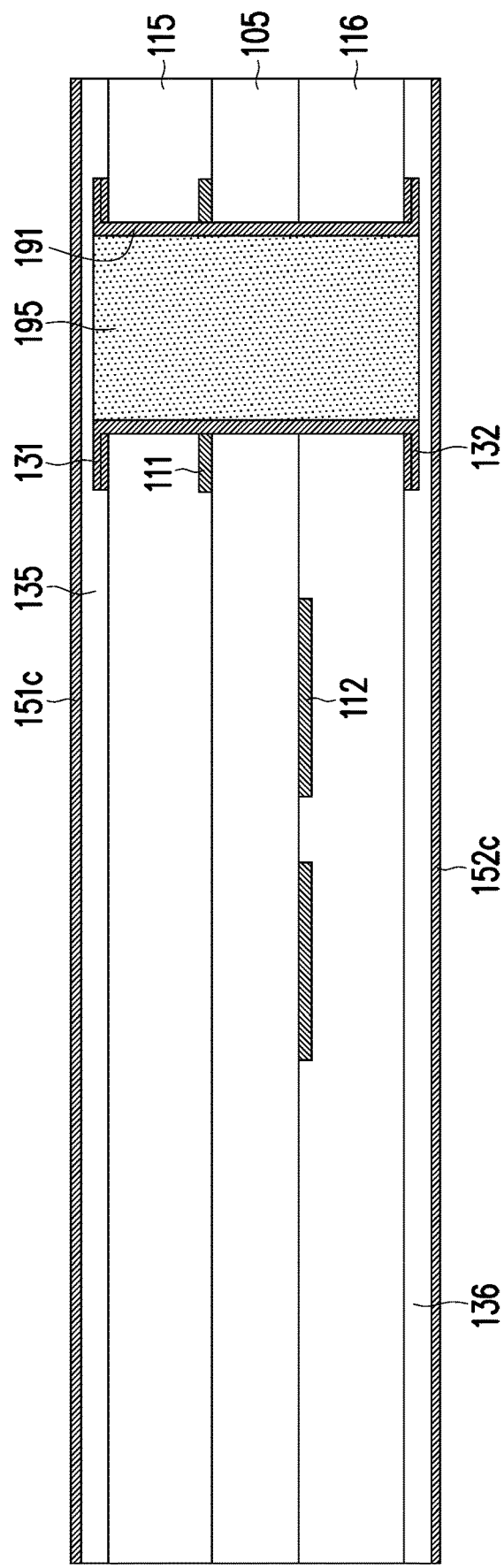
Figure 1G:
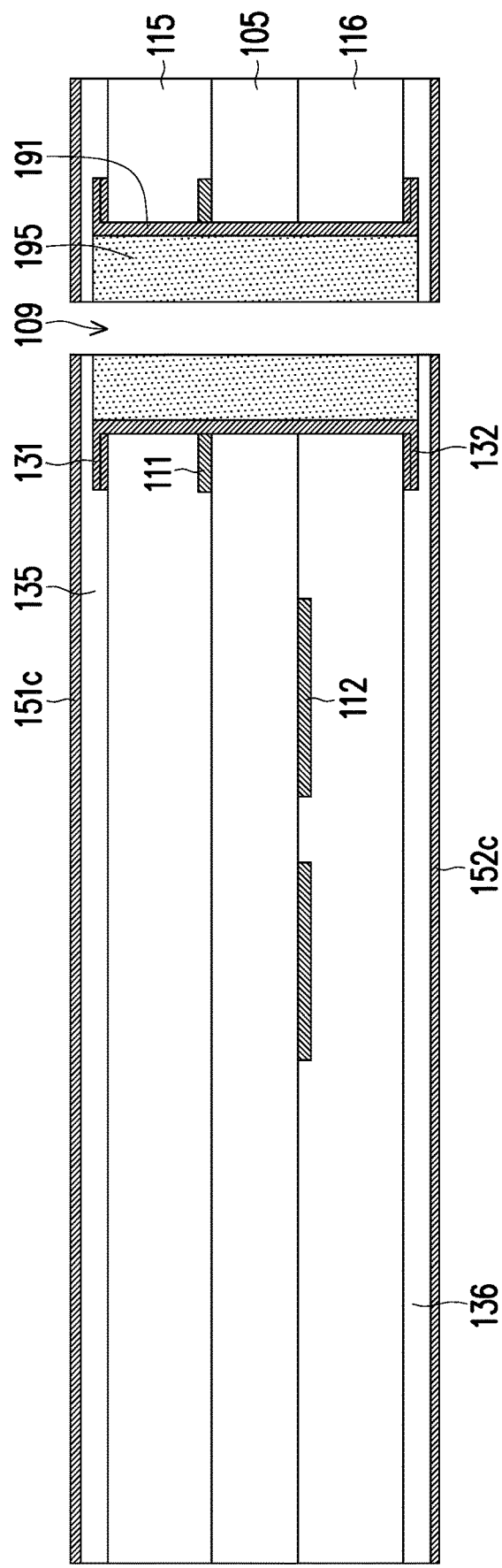
Figure 1H:
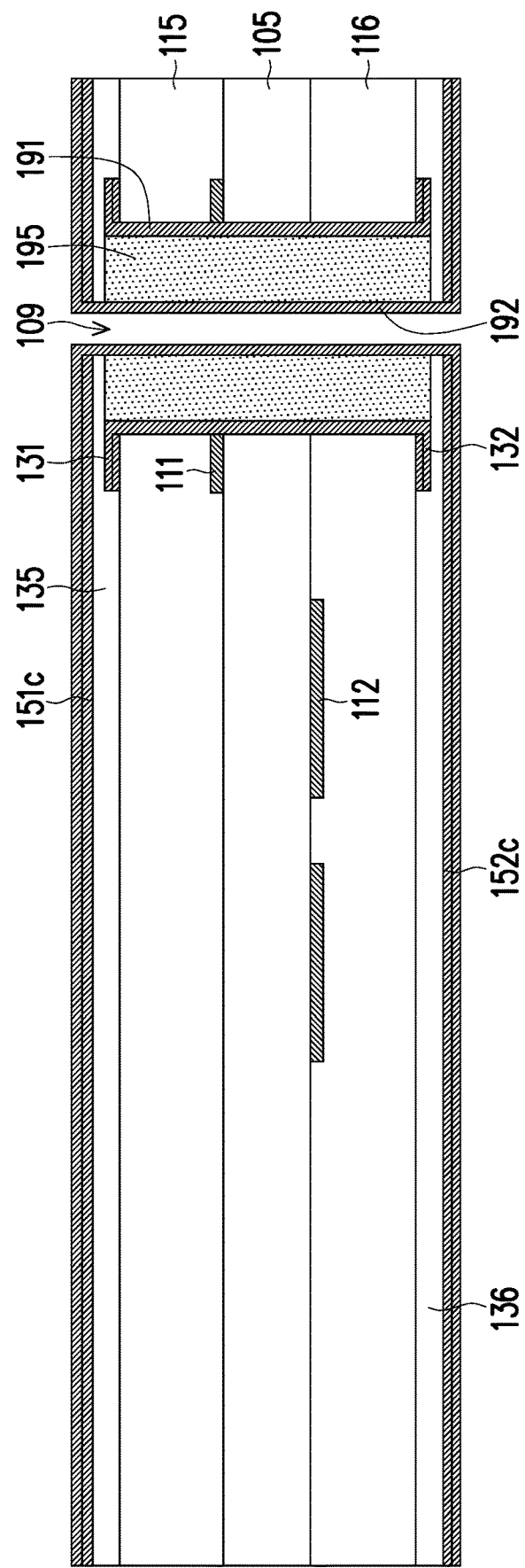
Figure 1I:
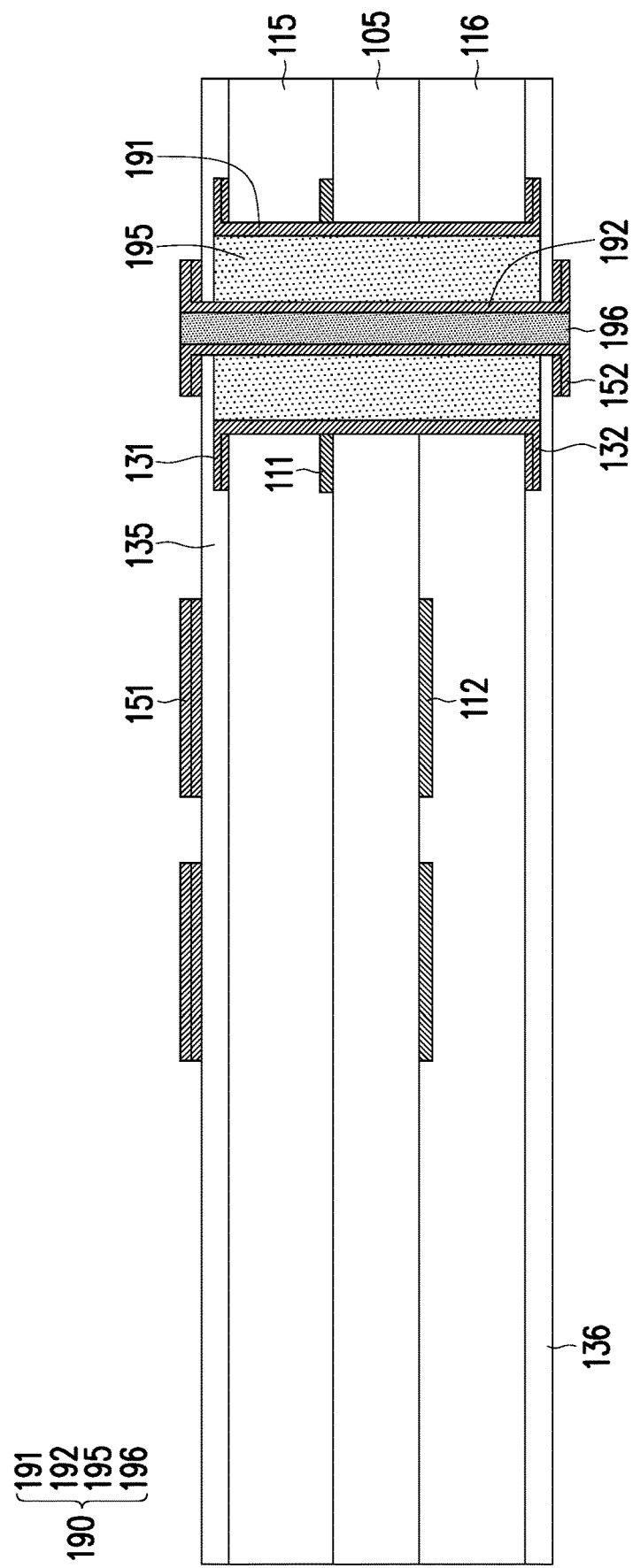
Figure 1J:
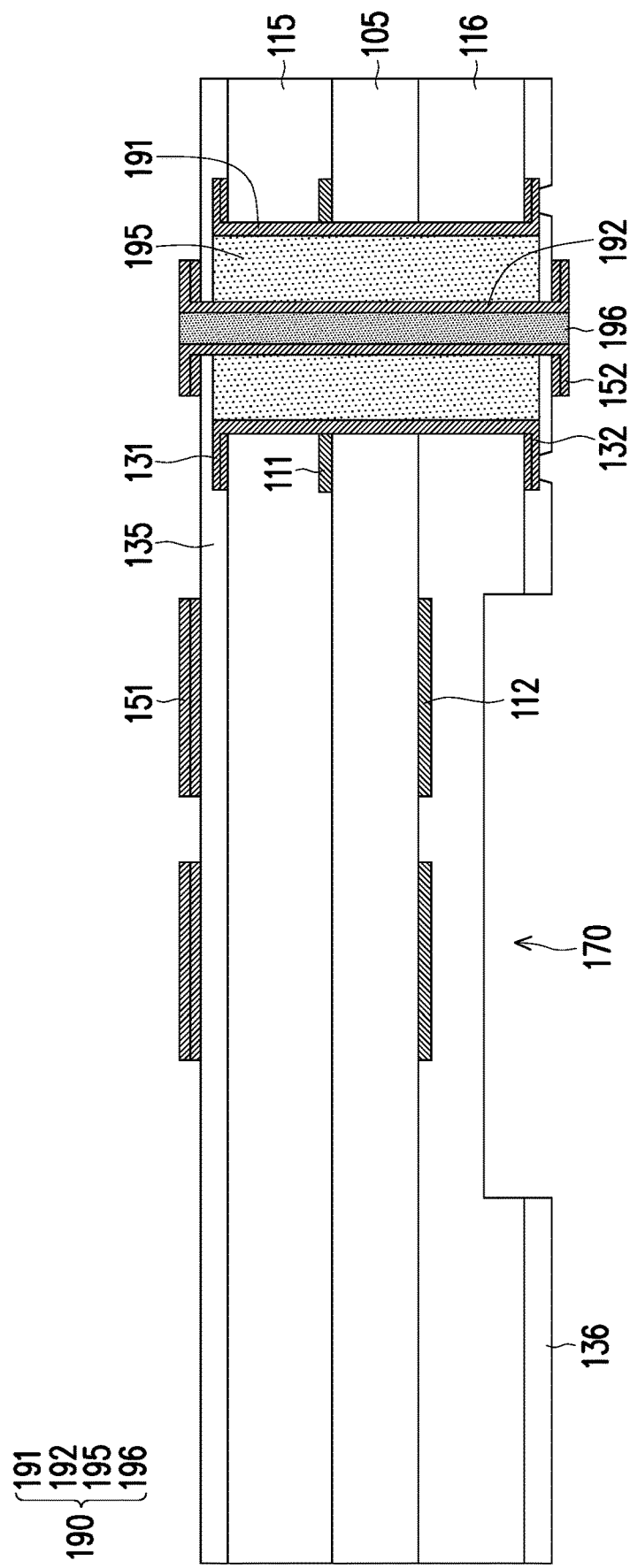
Figure 1K:
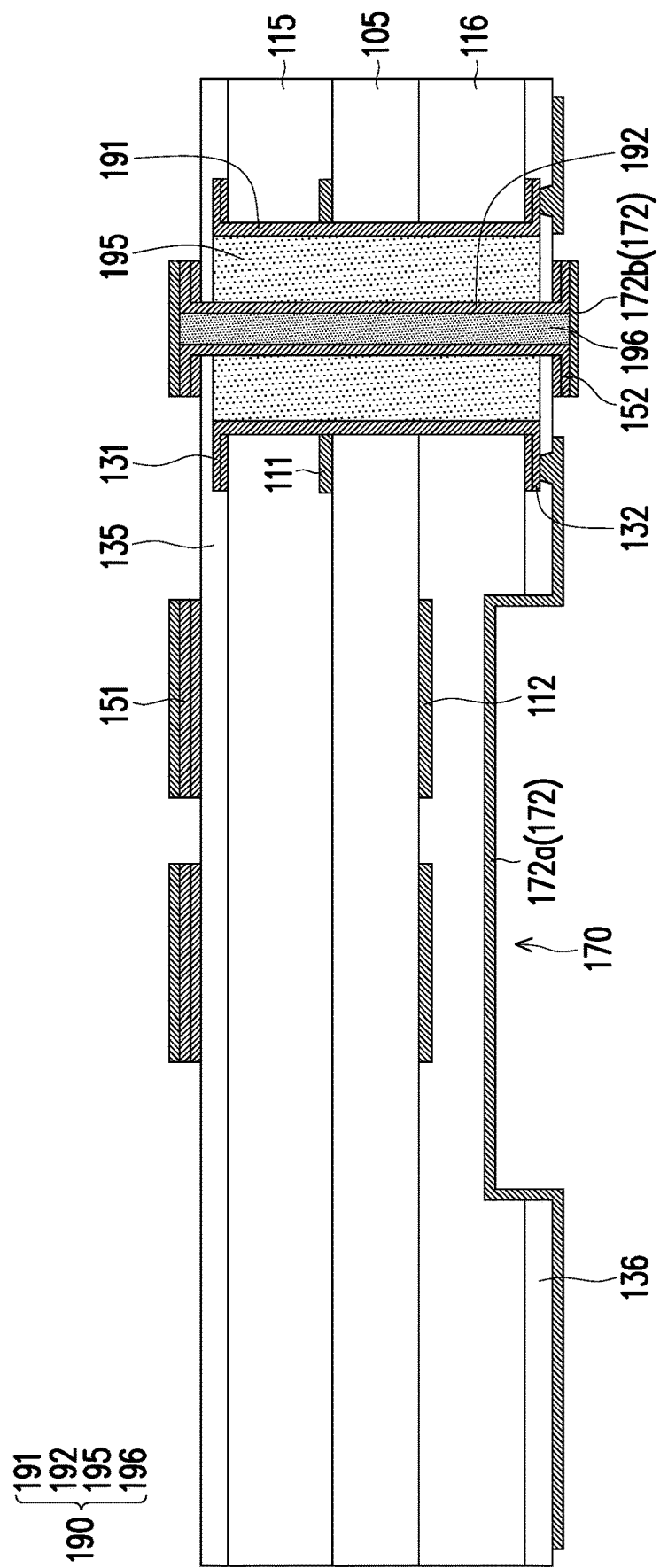
Figure 1L:
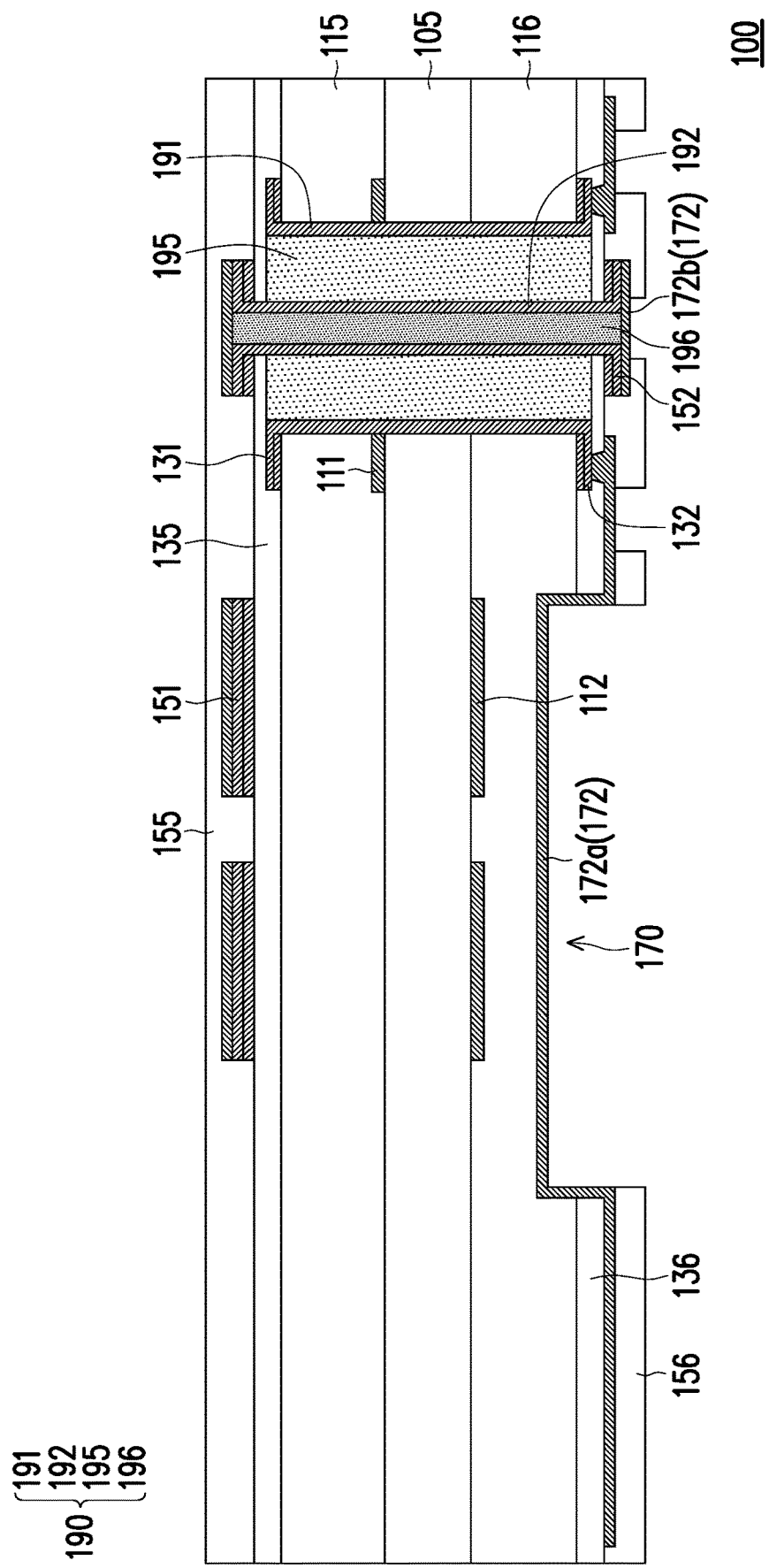
Figure 1M:
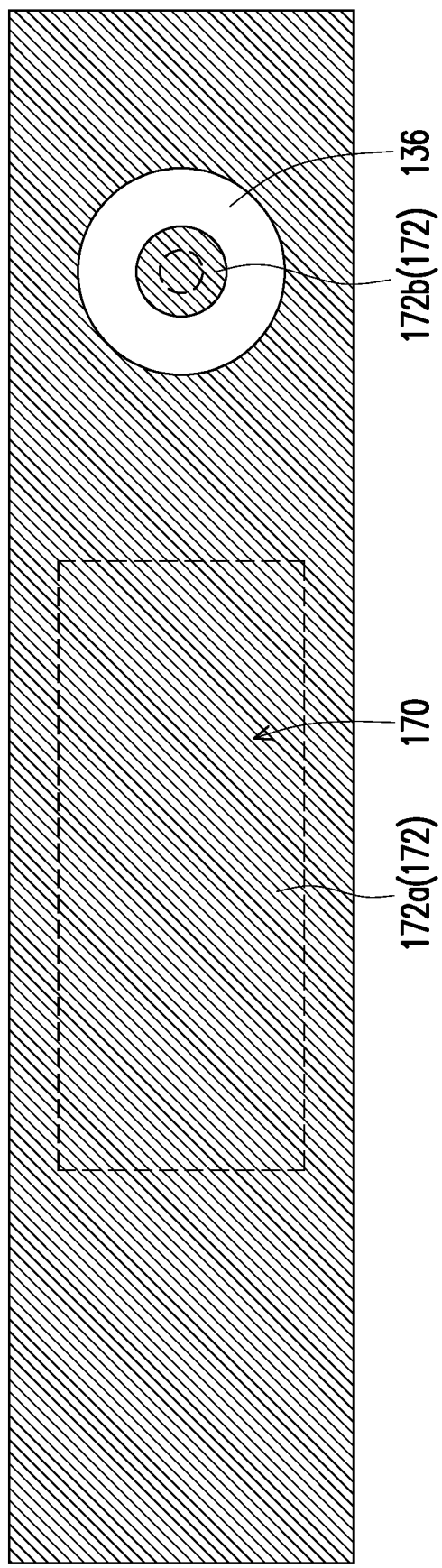

A manufacturing method of the first circuit structure 100 (as shown in FIG. 1L) may be shown in FIG. 1A to FIG. 1M. FIG. 1A to FIG. 1L may be a portion of cross-sectional schematic drawing of the partial manufacturing method of the first circuit structure 100. FIG. 1M may be a partial bottom view schematic drawing of the partial manufacturing method of the first circuit structure 100. FIG. 1M may be a bottom view schematic drawing corresponding to FIG. 1K.

Referring to FIG. 1A, a core structure 101 is provided.

In an embodiment, the core structure 101 may include a first core layer 105. The first core layer 105 may include a polymer glass fiber composite material substrate, a glass substrate, a ceramic substrate, an insulating silicon substrate, or a polyimide (PI) glass fiber composite substrate, but the disclosure is not limited thereto.

In an embodiment, the thickness of the first core layer 105 may be approximately 200 micrometers (µm).

In an embodiment, the core structure 101 may further include a circuit layer disposed on a surface of the first core layer 105. For example, the core structure 101 may further include a first upper circuit layer 111 and a first lower circuit layer 112. The first upper circuit layer 111 and the first lower circuit layer 112 are respectively disposed on an upper surface and a lower surface of the first core layer 105. The layout design of a circuit layer (e.g., the first upper circuit layer 111 or the first lower circuit layer 112, but not limited thereto) may be adjusted according to a design requirement, and is not limited in this disclosure.

In an embodiment, the core structure 101 may include a patterned copper clad laminate (CCL), but the disclosure is not limited thereto.

In an embodiment not shown or a cross-section not shown, a corresponding circuit in the first upper circuit layer 111 and a corresponding circuit in the first lower circuit layer 112 may be electrically connected to each other through a conductive via (not shown) penetrating the first core layer 105.

Referring to FIG. 1B, corresponding insulating layers may be formed on an upper side and a lower side of the first core layer 105, respectively. For example, a first upper insulating layer 115 and a first lower insulating layer 116 may be disposed on the upper surface and the lower surface of the first core layer 105, respectively.

The insulating layer (e.g., the first upper insulating layer 115 and/or the first lower insulating layer 116) may be formed by an appropriate process. In an embodiment, the insulating layer may be formed by a coating and curing process (e.g., photocuring, thermal curing, or static curing); for example, the insulating layer may include a polyimide coating layer. In an embodiment, the insulating layer may be formed by a laminating process; for example, the insulating layer may include a polyimide dry film or a prepreg (PP).

In an embodiment, an insulating layer may cover a corresponding circuit layer. For example, the first upper insulating layer 115 may cover the first upper circuit layer 111; and/or, the first lower insulating layer 116 may cover the first lower circuit layer 112.

In an embodiment, the first upper insulating layer 115 or the first lower insulating layer 116 may directly contact a portion of the first core layer 105.

In an embodiment, a thickness value of the first upper insulating layer 115 and a thickness value of the first lower insulating layer 116 may be equal or similar. For example, a ratio of the thickness of the first upper insulating layer 115 to the thickness of the first lower insulating layer 116 may be between 90% and 110%. In an embodiment, the thickness of the first upper insulating layer 115 or the thickness of the first lower insulating layer 116 may be approximately 250 micrometers.

Still referring to FIG. 1B, in an embodiment, a conductive layer may be disposed on the insulating layer. For example, a third upper conductive layer 131c may cover the first upper insulating layer 115, and/or a third lower conductive layer 132c may cover the first lower insulating layer 116.

In an embodiment, the conductive layer disposed on the insulating layer may be formed by a sputtering process. In an embodiment, the conductive layer (e.g., the third upper conductive layer 131c and/or the third lower conductive layer 132c) disposed on the insulating layer may be referred to as a plating seed layer.

In an embodiment, the conductive layer disposed on the insulating layer may be formed by a laminating process. In an embodiment, the insulating layer and the conductive layer disposed thereon (e.g., the first upper insulating layer 115 and the third upper conductive layer 131c; and/or, the first lower insulating layer 116 and the third lower conductive layer 132c) may be a copper clad laminate (CCL).

In an embodiment, a thickness value of the third upper conductive layer 131c and a thickness value of the third lower conductive layer 132c may be equal or similar. For example, a ratio of the thickness of the third upper conductive layer 131c to the thickness of the third lower conductive layer 132c may be between 90% and 110%.

Referring to FIG. 1C, at least one through hole 108 is formed. The through hole 108 may penetrate the first core layer 105 and a portion of film layer disposed thereon. For example, the through hole 108 may penetrate a portion of the first upper circuit layer 111, a portion of the third upper conductive layer 131c, and/or a portion of the third lower conductive layer 132c. In an embodiment, the through hole 108 may be formed by a laser drilling process, a mechanical drilling process, and/or another suitable process.

It is worth noting that only one through hole 108 is exemplary shown in FIG. 1C, but the disclosure is not limited thereto. In an embodiment not shown or a cross-section not shown, there may be another through hole the same or similar to the through hole 108.

Referring to FIG. 1D, a conductive layer (which may be referred to as an outer conductive layer) 191 is formed on an inner wall of the through hole 108. In an embodiment, a corresponding electroplating layer may be formed on the third upper conductive layer 131c and/or the third lower conductive layer 132c by an electroplating process. The aforementioned electroplating layer may further extend to the inner wall of the through hole 108, thereby forming the corresponding conductive layer 191. In an embodiment, the conductive layer 191 on the inner wall may include a copper layer.

In an embodiment, a shape (e.g., covering range and/or thickness) of the conductive layer 191 covering the inner wall may be adjusted by an appropriate electroplating process and/or parameter (e.g., electroplating time, electroplating current, concentration of the electroplating solution).

In an embodiment, the conductive layer 191 may completely cover the inner wall of the through hole 108.

In another embodiment, a conductive layer similar to the conductive layer 191 may partially cover the inner wall of the through hole 108. For example, a current source used for electroplating may be applied only to the third lower conductive layer 132c, and not to the third upper conductive layer 131c. In this way, the portion of the inner wall of the through hole 108 closer to the third upper conductive layer 131c may not be covered by the conductive layer.

In an embodiment, the conductive layer 191 does not completely fill the through hole 108. In an embodiment, in a direction perpendicular to the extension direction of the through hole 108, the maximum distance of the inner edge of the conductive layer 191 may be approximately 400 micrometers to 500 micrometers. That is, the inner diameter of the through hole 108 covered with the conductive layer 191 may be approximately 400 micrometers to 500 micrometers.

Referring to FIG. 1E, a first dielectric layer 195 is formed in the through hole 108 covered with the conductive layer 191. A material of the first dielectric layer 195 may include a hole-filling resin, a polymer mixed with glass/ceramic, or another suitable dielectric material.

In an embodiment, the first dielectric layer 195 may have a smoother outer surface by an appropriate planarization process (e.g., a polishing process), but the disclosure is not limited thereto.

Still referring to FIG. 1E, the third upper conductive layer 131c and the electroplating layer disposed thereon may be patterned by an appropriate patterning process (e.g., a photolithography and etching process) to form a third upper circuit layer 131 correspondingly; and/or, the third lower conductive layer 132c and the electroplating layer disposed thereon may be patterned by an appropriate patterning process (e.g., a photolithography and etching process) to form a third lower circuit layer 132 correspondingly. In other words, the third upper circuit layer 131 or the third lower circuit layer 132 may include stacked conductive layers.

Referring to FIG. µF, corresponding insulating layers may be formed on the upper side and the lower side of the first core layer 105 respectively. For example, the third upper insulating layer 135 and the third lower insulating layer 136 may be disposed on the upper surface and lower surface of the first core layer 105, respectively.

The insulating layer may be formed by an appropriate process. For example, the insulating layer (e.g., the third upper insulating layer 135 and/or the third lower insulating layer 136) may include a polyimide coating layer, a polyimide dry film or a prepreg (PP).

In an embodiment, an insulating layer may cover a corresponding circuit layer. For example, the third upper insulating layer 135 may cover the third upper circuit layer 131, and/or the third lower insulating layer 136 may cover the third lower circuit layer 132.

In an embodiment, the third upper insulating layer 135 may directly contact a portion of the first upper insulating layer 115; and/or, the third lower insulating layer 136 may directly contact a portion of the first lower insulating layer 116.

In an embodiment, a thickness value of the third upper insulating layer 135 and a thickness value of the third lower insulating layer 136 may be equal or similar. For example, a ratio of the thickness of the third upper insulating layer 135 to the thickness of the third lower insulating layer 136 may be between 90% and 110%. In an embodiment, the thickness of the third upper insulating layer 135 and/or the thickness of the third lower insulating layer 136 may be less than the thickness of the first upper insulating layer 115 and/or the thickness of the first lower insulating layer 116. In an embodiment, the thickness of the third upper insulating layer 135 or the third lower insulating layer 136 may be approximately 50 micrometers.

Still referring to FIG. 1F, in an embodiment, a conductive layer may be disposed on the insulating layer. For example, the fifth upper conductive layer 151c may cover the third upper insulating layer 135; and/or, the fifth lower conductive layer 152c may cover the third lower insulating layer 136.

In an embodiment, the conductive layer disposed on the insulating layer may be formed by a sputtering process. In an embodiment, the conductive layer (e.g., the fifth upper conductive layer 151c and/or the fifth lower conductive layer 152c) disposed on the insulating layer may be referred to as a plating seed layer.

In an embodiment, the conductive layer disposed on the insulating layer may be formed by a laminating process. In an embodiment, the insulating layer and the conductive layer disposed thereon (e.g., the third upper insulating layer 135 and the fifth upper conductive layer 151c; and/or, the third lower insulating layer 136 and the fifth lower conductive layer 152c) may be a copper clad laminate (CCL).

In an embodiment, a thickness value of the fifth upper conductive layer 151c and a thickness value of the fifth lower conductive layer 152c may be equal or similar. For example, a ratio of the thickness of the fifth upper conductive layer 151c to the thickness of the fifth lower conductive layer 152c may be between 90% and 110%.

Referring to FIG. 1G, at least one through hole 109 is formed. The through hole 109 may penetrate the first dielectric layer 195 and a film layer (e.g., the fifth upper conductive layer 151c, the third upper insulating layer 135, the third lower insulating layer 136 and/or the fifth lower conductive layer 152c) disposed thereon. In an embodiment, the through hole 109 may be formed by a laser drilling process, a mechanical drilling process, and/or another suitable process.

In an embodiment, the conductive layer 191 or any circuit electrically contacted thereto does not be exposed by the through hole 109.

Referring to FIG. 1H, a conductive layer (which may be referred to as an inner conductive layer) 192 is formed on an inner wall of the through hole 109. In an embodiment, a corresponding electroplating layer may be formed on the fifth upper conductive layer 151c and/or the fifth lower conductive layer 152c by an electroplating process. The aforementioned electroplating layer may further extend to the inner wall of the through hole 109, thereby forming the corresponding conductive layer 192. In an embodiment, the conductive layer 192 on the inner wall may include a copper layer.

In an embodiment, the conductive layer 192 may completely cover the inner wall of the through hole 109.

In an embodiment, the conductive layer 192 does not completely fill the through hole 109. In an embodiment, in a direction perpendicular to the extension direction of the through hole 109, the maximum distance of the inner edge of the conductive layer 192 may be approximately 50 micrometers to 150 micrometers. That is, the inner diameter of the through hole 109 covered with the conductive layer 192 may be approximately 50 micrometers to 150 micrometers.

In an embodiment not shown, the conductive layer 192 may completely fill the through hole 109. In an embodiment not shown, the conductive layer 192 within the through hole 109 may be a conductive pillar.

Referring to FIG. 1I, in an embodiment, a second dielectric layer 196 may be formed in the through hole 109 covered with the conductive layer 192. A material of the second dielectric layer 196 may include a hole-filling resin, a polymer mixed with glass/ceramic, or another suitable dielectric material.

In an embodiment, the second dielectric layer 196 may have a smoother outer surface by an appropriate planarization process (e.g., a polishing process), but the disclosure is not limited thereto.

In an embodiment, the outer conductive layer 191, the first dielectric layer 195, the inner conductive layer 192, and the second dielectric layer 196 may form a coaxial conductive via 190.

Still referring to FIG. 1I, the fifth upper conductive layer 151c and the electroplating layer disposed thereon may be patterned by an appropriate patterning process (e.g., a photolithography and etching process) to form a fifth upper circuit layer 151 correspondingly; and/or, the fifth lower conductive layer 152c and the electroplating layer disposed thereon may be patterned by an appropriate patterning process (e.g., a photolithography and etching process) to form a fifth lower circuit layer 152 correspondingly. In other words, the fifth upper circuit layer 151 or the fifth lower circuit layer 152 may include stacked conductive layers.

Referring to FIG. 1J, a cavity 170 is formed on a side of the first core layer 105. In an embodiment, a portion of the insulating layer (e.g., a portion of the third lower insulating layer 136 and a portion of the first lower insulating layer 116) may be removed by an etching process, an ablation process, a milling process, or another suitable process to form a corresponding cavity 170.

In an embodiment, a depth of cavity 170 may be approximately 200 micrometers.

In an embodiment, during the process of forming the cavity 170, a portion of the third lower insulating layer 136 may be removed, thereby a portion of the third lower circuit layer 132 may be exposed.

Referring to FIG. 1K and FIG. 1M, in an embodiment, a bottom circuit layer 172 may be formed on the side of the first core layer 105 corresponding to the cavity 170. The bottom circuit layer 172 may be formed by a sputtering process, an electroplating process, a photolithography and etching process, and/or another suitable process.

In an embodiment, the bottom circuit layer 172 at least completely covers the cavity 170.

Still referring to FIG. 1K, in an embodiment, a corresponding conductive layer may be disposed on the fifth upper circuit layer 151. In an embodiment, the conductive layer disposed on the fifth upper circuit layer 151 may further cover a side of the second dielectric layer 196.

Structurally, a conductive layer disposed on the fifth upper circuit layer 151 may directly contact the fifth upper circuit layer 151 to form a conductive structure having stacked multiple conductive layers, and there is no insulating material or dielectric material between the aforementioned conductive structure. For simplicity, the fifth upper circuit layer 151 and the conductive layer disposed thereon may still be referred to as the fifth upper circuit layer, with the same symbol of 151.

Referring to FIG. 1L, in an embodiment, corresponding insulating layers may be formed on the upper side and the lower side of the first core layer 105, respectively. For example, the fifth upper insulating layer 155 and the fifth lower insulating layer 156 may be disposed on the upper surface and lower surface of the first core layer 105, respectively.

In an embodiment, a thickness of the fifth upper insulating layer 155 or a thickness of the fifth lower insulating layer 156 may be approximately 20 micrometers.

In an embodiment, the fifth upper insulating layer 155 and/or the fifth lower insulating layer 156 may be referred to as a solder resist layer. In an embodiment, the solder resist layer of the first circuit structure 100 may be an outermost insulating layer thereof. For example, the fifth upper insulating layer 155 may be the topmost insulating layer in the first circuit structure 100, and/or the fifth lower insulating layer 156 may be the bottommost insulating layer in the first circuit structure 100.

In an embodiment, the bottom circuit layer 172 of the first circuit structure 100 may be the lowest conductive layer thereof.

After the above process, the fabrication of a first circuit structure 100 of an embodiment may be substantially completed.

Referring to FIG. 1L, the bottom side of the first circuit structure 100 has at least one cavity 170, and the first circuit structure 100 may further include at least one coaxial conductive through via 190.

In an embodiment, the coaxial conductive via 190 may include the outer conductive layer 191, the first dielectric layer 195, and the inner conductive layer 192. The first dielectric layer 195 is disposed between the outer conductive layer 191 and the inner conductive layer 192. The outer conductive layer 191 at least partially surrounds the inner conductive layer 192. The outer conductive layer 191 and the inner conductive layer 192 are electrically isolated from each other.

In an embodiment, the coaxial conductive via 190 may further include a second dielectric layer 196. The inner conductive layer 192 may be disposed between the first dielectric layer 195 and the second dielectric layer 196.

In an embodiment, the first circuit structure 100 may include the first core layer 105, one or more corresponding circuit layers disposed on the upper side and/or lower side of the first core layer 105, and/or one or more corresponding insulating layers disposed on the upper side and/or lower side of the first core layer 105. The cavity 170 is disposed on the lower side of the first core layer 105. The coaxial conductive through via 190 penetrates the first core layer 105 and a portion of the insulating layer. The coaxial conductive through via 190 is electrically connected to a corresponding circuit in the circuit layer.

For example, the first circuit structure 100 may include the fifth upper insulating layer 155, the fifth upper circuit layer 151, the third upper insulating layer 135, the third upper circuit layer 131, the first upper insulating layer 115, the first upper circuit layer 111, the first core layer 105, the first lower circuit layer 112, the first lower insulating layer 116, the third lower circuit layer 132, the third lower insulating layer 136, the fifth lower circuit layer 152, and the fifth lower insulating layer 156. The cavity 170 penetrates through a portion of the third lower insulating layer 136 and is recessed in a portion of the first lower insulating layer 116. The coaxial conductive via 190 penetrates the first upper insulating layer 115, the first core layer 105, and the first lower insulating layer 116. The inner conductive layer 192 of the coaxial conductive via 190 is electrically connected to a corresponding circuit in the fifth upper circuit layer 151 and a corresponding circuit in the fifth lower circuit layer 152. The outer conductive layer 191 of the coaxial conductive via 190 is electrically connected to a corresponding circuit in the third upper circuit layer 131 and/or a corresponding circuit in the first upper circuit layer 111; and, the outer conductive layer 191 of the coaxial conductive via 190 is electrically connected to a corresponding circuit in the third lower circuit layer 132 and/or another corresponding circuit (other than the circuit to which the inner conductive layer 192 is electrically connected) in the fifth lower circuit layer 152.

In an embodiment, the first circuit structure 100 may further include the bottom circuit layer 172. The bottom circuit layer 172 may include a first circuit portion 172a and a second circuit portion 172b. The first circuit portion 172a and the second circuit portion 172b are electrically isolated from each other.

The first circuit portion 172a may be electrically connected to the outer conductive layer 191. For example, the first circuit portion 172a may be embedded in the third lower insulating layer 136 and may be electrically connected to the outer conductive layer 191 through a corresponding circuit in a portion of the third lower circuit layer 132 exposed by the third lower insulating layer 136.

The second circuit portion 172b may be electrically connected to the inner conductive layer 192. For example, the second circuit portion 172b may be electrically connected to the inner conductive layer 192 through a corresponding circuit in the fifth lower circuit layer 152.

In an embodiment, the first circuit portion 172a at least completely covers the cavity 170. For example, the first circuit portion 172a at least completely covers the side wall and bottom of the cavity 170.

In an embodiment, a portion of one or more circuit layers may be disposed between the fifth lower insulating layer 156 and the third lower insulating layer 136. For example, a portion of the first circuit portion 172a and/or a portion of the second circuit portion 172b may be disposed between the fifth lower insulating layer 156 and the third lower insulating layer 136.

In an embodiment, a portion of the layers (e.g., the insulating layers) on both sides of the first core layer 105 may be arranged and/or disposed symmetrically. In this way, during the fabrication and/or subsequent application of the first circuit structure 100, the degree and/or possibility of warpage may be reduced, thereby the yield and/or quality of the first circuit structure 100 could be improved.

For example, the first upper insulating layer 115 and the first lower insulating layer 116 may be disposed on both sides of the first core layer 105, and the thickness and/or material of the first upper insulating layer 115 and the first lower insulating layer 116 may be the same or similar. For further example, the first upper insulating layer 115 and the first lower insulating layer 116 may respectively contact the two sides of the first core layer 105.

For example, the third upper insulating layer 135 and the third lower insulating layer 136 may be disposed on both sides of the first core layer 105, and the thickness and/or material of the third upper insulating layer 135 and the third lower insulating layer 136 may be the same or similar. For further example, the third upper insulating layer 135 and the third lower insulating layer 136 may respectively contact the first upper insulating layer 115 and the first lower insulating layer 116.

For example, the fifth upper insulating layer 155 and the fifth lower insulating layer 156 may be disposed on both sides of the first core layer 105, and the thickness and/or material of the fifth upper insulating layer 155 and the fifth lower insulating layer 156 may be the same or similar. For further example, the fifth upper insulating layer 155 and the fifth lower insulating layer 156 may respectively contact the third upper insulating layer 135 and the third lower insulating layer 136.

<Second Circuit Structure>

The manufacturing method of a second circuit structure 200 may be similar to the manufacturing method of the first circuit structure 100.

Figure 1N:
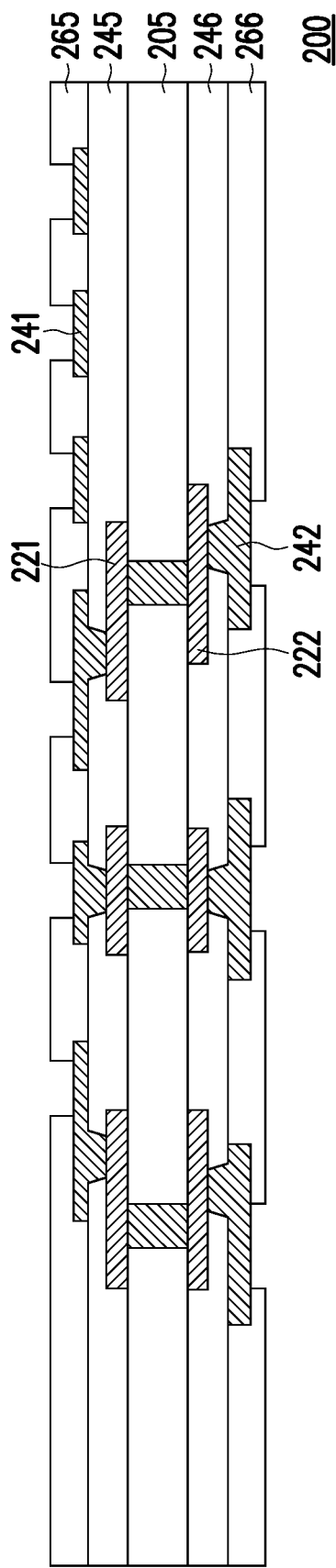

Referring to FIG. 1N, the second circuit structure 200 may include a second core layer 205, one or more corresponding circuit layers disposed on the upper side and/or lower side of the second core layer 205, and/or one or more corresponding insulating layers disposed on the upper side and/or lower side of the second core layer 205. For example, the second circuit structure 200 may include a sixth upper insulating layer 265, a fourth upper circuit layer 241, a fourth upper insulating layer 245, a second upper circuit layer 221, the second core layer 205, a second lower circuit layer 222, a fourth lower insulating layer 246, a fourth lower circuit layer 242, and a sixth lower insulating layer 266.

In an embodiment, the second core layer 205 may include a polymer glass fiber composite material substrate, a glass substrate, a ceramic substrate, an insulating silicon substrate, or a polyimide (PI) glass fiber composite substrate, but the disclosure is not limited thereto. In an embodiment, the second circuit structure 200 may be referred to as a rigid board.

In an embodiment, the second core layer 205 may include a polyimide (PI) substrate, a polyethylene terephthalate (PET) substrate, or a polymer flexible substrate, but the disclosure is not limited thereto. In an embodiment, the second circuit structure 200 may be referred to as a flexible board.

In an embodiment, the second circuit structure 200 may be a rigid-flex board.

In an embodiment, the thickness of the second core layer 205 may be approximately 60 micrometers.

In an embodiment, a material and/or a formation method of the fourth upper circuit layer 241, the fourth lower circuit layer 242, the second upper circuit layer 221, and/or the second lower circuit layer 222 may be the same or similar to a material and/or a formation method of an aforementioned circuit layer (e.g., the fifth upper circuit layer 151, the fifth lower circuit layer 152, the third upper circuit layer 131, the third lower circuit layer 132, the first upper circuit layer 111, and/or the first lower circuit layer 112).

In an embodiment, a corresponding circuit in the second upper circuit layer 221 and a corresponding circuit in the second lower circuit layer 222 may be electrically connected to each other through a conductive via (as shown in FIG. 1N but not labeled) penetrating the second core layer 205.

In an embodiment, a material and/or a formation method of the fourth upper insulating layer 245 and/or the fourth lower insulating layer 246 may be the same or similar to a material and/or a formation method of the aforementioned first upper insulating layer 115, first lower insulating layer 116, third upper insulating layer 135, and/or third lower insulating layer 136.

In an embodiment, the thickness of the fourth upper insulating layer 245 or the fourth lower insulating layer 246 may be approximately 25 micrometers.

In an embodiment, a material and/or a formation method of the sixth upper insulating layer 265 and/or the sixth lower insulating layer 266 may be the same or similar to a material and/or a formation method of the aforementioned fifth upper insulating layer 155 and/or the fifth lower insulating layer 156.

In an embodiment, the thickness of the sixth upper insulating layer 265 or the thickness of the sixth lower insulating layer 266 may be approximately 20 micrometers.

In an embodiment, the sixth upper insulating layer 265 and/or the sixth lower insulating layer 266 may be referred to as a solder resist layer. In an embodiment, the solder resist layer of the second circuit structure 200 may be an outermost insulating layer thereof.

In an embodiment, the sixth upper insulating layer 265 may have a corresponding opening that may expose a portion of corresponding circuit in the fourth upper circuit layer 241. In an embodiment, the portion of the fourth upper circuit layer 241 exposed by the opening of the sixth upper insulating layer 265 may be referred to as a connect pad.

In an embodiment, the sixth lower insulating layer 266 may have a corresponding opening that may expose a portion of corresponding circuit in the fourth lower circuit layer 242. In an embodiment, the portion of the fourth lower circuit layer 242 exposed by the opening of the sixth lower insulating layer 266 may be referred to as connect pad.

<Integration of the Second Circuit Structure and Electronic Device>

Figure 1O:
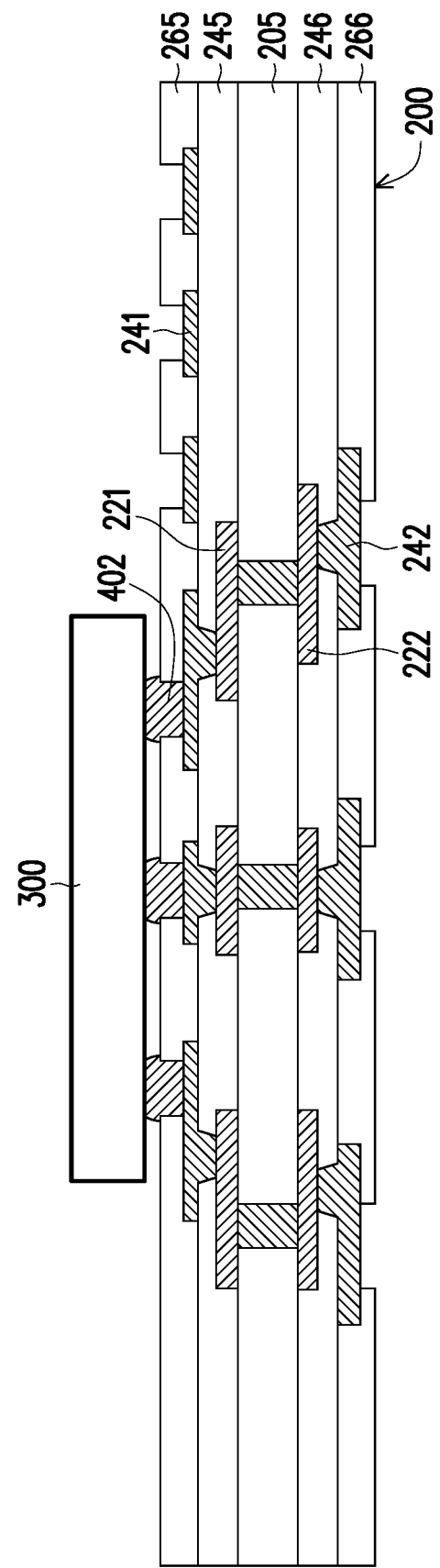

Referring to FIG. 1O, an electronic device 300 may be disposed on the second circuit structure 200, and the electronic device 300 is electrically connected to a corresponding circuit in the fourth upper circuit layer 241.

In an embodiment, the electronic device 300 may be electrically connected to the corresponding circuit in the fourth upper circuit layer 241 through a corresponding conductive connector 402. The conductive connector 402 may include a conductive pillar (e.g., a copper pillar), a solder (e.g., a solder ball), a conductive paste (e.g., a silver paste or a tin paste), or another suitable conductive component.

In an embodiment, the electronic device 300 may be electrically connected to the corresponding circuit in the fourth upper circuit layer 241 through flip-chip bonding.

In an embodiment, the electronic device 300 may include a corresponding communication module. For example, the electronic device 300 may be adapted to receive and/or transmit signal through a corresponding antenna. In an embodiment, the electronic device 300 may include a communication chip.

<Electronic Packaging Structure>

Figure 1P:
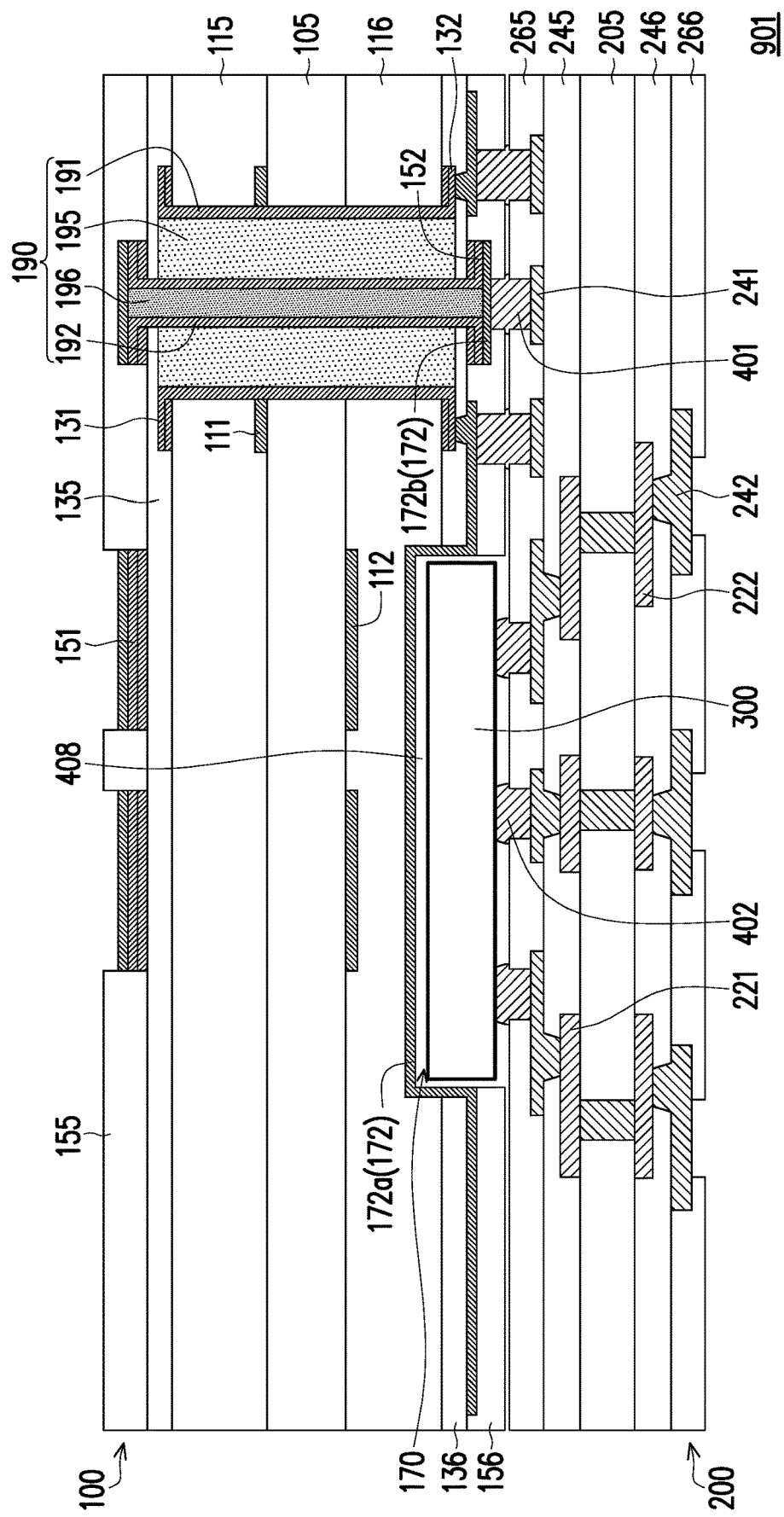

Referring to FIG. 1P, a corresponding circuit in the first circuit structure 100 is electrically connected to a corresponding circuit in the second circuit structure 200 integrated with electronic device 300. Additionally, the electronic device 300 is disposed corresponding to the cavity 170 of the first circuit structure 100. The electronic device 300 is disposed between the first circuit structure 100 and the second circuit structure 200. The electronic device 300 is at least partially disposed within the cavity 170 of the first circuit structure 100.

A corresponding circuit in the second circuit structure 200 and a corresponding circuit in the first circuit structure 100 may be electrically connected through a corresponding conductive connector 401. The conductive connectors 401 may include a conductive pillar (e.g., a copper pillar), a solder (e.g., a solder ball), a conductive paste (e.g., a silver paste or a tin paste), or another suitable conductive component.

After the above process, the fabrication of an embodiment of an electronic packaging structure 901 may be substantially completed. It is worth noting that the disclosure does not limit the fabrication sequence of the first circuit structure 100 and the second circuit structure 200.

The electronic packaging structure 901 includes the first circuit structure 100, the second circuit structure 200, and at least one electronic device 300. The bottom side of the first circuit structure 100 has at least one cavity 170. The first circuit structure 100 includes at least one coaxial conductive through via 190. The first circuit structure 100 is disposed on the second circuit structure 200. The first circuit structure 100 and the second circuit structure 200 are electrically connected to each other. The electronic device 300 is disposed on the second circuit structure 200. The electronic device 300 is disposed corresponding to the cavity 170 of the first circuit structure 100.

In an embodiment, the electronic packaging structure 901 may further include an insulating filler material 408. The insulating filler material 408 may be disposed between the first circuit structure 100 and the second circuit structure 200, and/or filled in the cavity 170 of the first circuit structure 100.

In an embodiment, the insulating filler material 408 may include an insulating thermal conductive material. For example, the thermal conductive material may be filled in the cavity 170 of the first circuit structure 100, and the thermal conductive material may be thermally coupled to the electronic device 300 and the first circuit portion 172*a* disposed within the cavity 170. In this way, when the electronic device 300 is in operation, the generated heat may be more easily or quickly transferred to the outside. The thermal conductive material may be a thermal interface material (TIM), but the disclosure is not limited thereto.

In an embodiment, along a direction parallel to the thickness of the first circuit structure 100, the electronic device 300 completely overlaps the first circuit portion 172*a* within the cavity 170. Moreover, the first circuit portion 172*a* may be grounded. The aforementioned grounding may include floating ground or physical ground. Therefore, the first circuit portion 172*a* may be referred to as an electromagnetic interference shielding (EMI shielding) layer. In this way, when the electronic device 300 is in operation, the possibility of the electronic device 300 interfering with other components or being interfered by another component may be reduced, and signal quality may be improved or better.

In an embodiment, at least a portion of a circuit in the fifth upper circuit layer 151 may be an antenna. The electronic device 300 may be electrically connected to the aforementioned antenna through a corresponding circuit in the second circuit structure 200 and the inner conductive layer 192 of the coaxial conductive through via 190 in the first circuit structure 100. In an embodiment, the antenna electrically connected to the electronic device 300 may be referred to as a driven antenna. In an embodiment, the portion of the fifth upper circuit layer 151 serving as an antenna may be the topmost conductive layer in the first circuit structure 100.

In an embodiment, the periphery of at least a portion of the current path between the electronic device 300 and the antenna electrically connected thereto may be surrounded, isolated, or shielded by a grounded conductor. In this way, signal interference may be reduced and/or signal quality may be improved or better.

In an embodiment, a portion of the circuit layer (e.g., a portion of the first lower circuit layer 112) between the grounded first circuit part 172*a* and the antenna electrically connected to the electronic device 300 may be referred to as a parasitic antenna, but the disclosure is not limited thereto.

Figure 2:
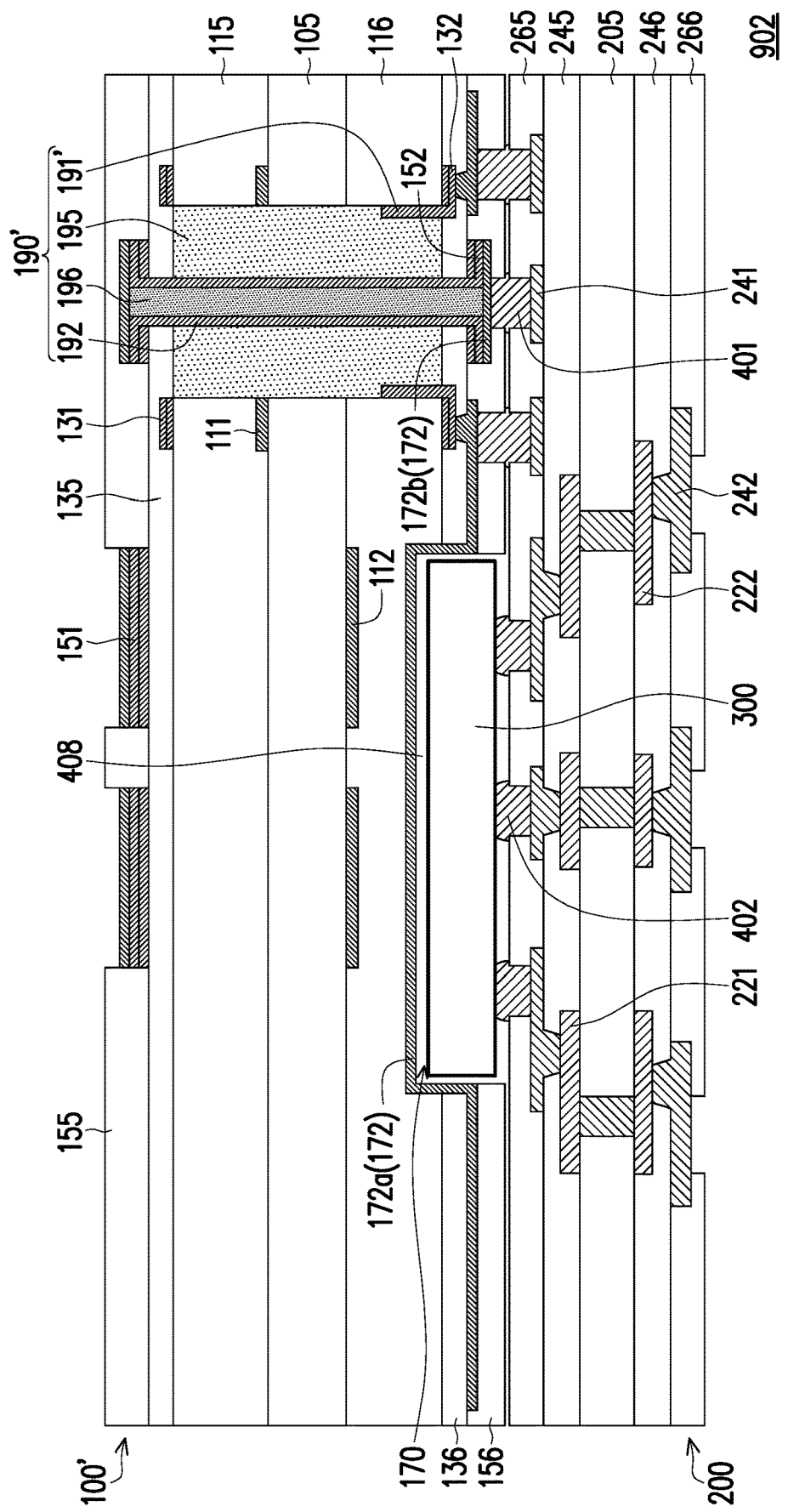
FIG. 2 is a partial schematic diagram of an electronic packaging structure according to a second embodiment of the disclosure.

FIG. 2 is a portion of cross-sectional schematic drawing of an electronic packaging structure according to a second embodiment of the disclosure. Referring to FIG. 2 and FIG. 1P, an electronic packaging structure 902 a manufacturing method thereof may be similar to the electronic packaging structure 901 and the manufacturing method thereof, a same or similar component may be represented by a same symbol, may have a similar function, and a corresponding description may be omitted.

The electronic packaging structure 902 includes a first circuit structure 100', a second circuit structure 200, and at least one electronic device 300. The first circuit structure 100' includes at least one coaxial conductive through via 190'.

In an embodiment, the coaxial conductive via 190' may include an outer conductive layer 191', a first dielectric layer 195, and an inner conductive layer 192. The first dielectric layer 195 is disposed between the outer conductive layer 191' and the inner conductive layer 192. The outer conductive layer 191' surrounds a portion of the inner conductive layer 192. The outer conductive layer 191' and the inner conductive layer 192 are electrically isolated from each other.

In an embodiment, in a direction perpendicular to the thickness of the first circuit structure 100', the outer conductive layer 191' is not disposed between the inner conductive layer 192 and the fifth upper circuit layer 151. Additionally, the fifth upper circuit layer 151 may be served only as an antenna (e.g., a driven antenna); or alternatively, the fifth upper circuit layer 151 may be served only as an antenna (e.g., a driven antenna) and a dummy pattern with no signal transmission.

In an embodiment, in a direction perpendicular to the thickness of the first circuit structure 100', the outer conductive layer 191' is not disposed between the inner conductive layer 192 and the third upper circuit layer 131. Additionally, the third upper circuit layer 131 may be served only as an antenna (e.g., a parasitic antenna); or alternatively, the third upper circuit layer 131 may be served only as an antenna (e.g., a parasitic antenna) and a dummy pattern with no signal transmission; or alternatively, the third upper circuit layer 131 may be served only as a dummy pattern with no signal transmission.

In an embodiment, in a direction perpendicular to the thickness of the first circuit structure 100', the outer conductive layer 191' is not disposed between the inner conductive layer 192 and the first upper circuit layer 111. Additionally, the first upper circuit layer 111 may be served only as an antenna (e.g., a parasitic antenna); or alternatively, the first upper circuit layer 111 may be served only as an antenna (e.g., a parasitic antenna) and a dummy pattern with no signal transmission; or alternatively, the first upper circuit layer 111 may be served only as a dummy pattern with no signal transmission.

In an embodiment, in a direction perpendicular to the thickness of the first circuit structure 100', the outer conductive layer 191' is not disposed between the inner conductive layer 192 and the first lower circuit layer 112. Additionally, the first lower circuit layer 112 may be served only as an antenna (e.g., a parasitic antenna); or alternatively, the first lower circuit layer 112 may be served only as an antenna (e.g., a parasitic antenna) and a dummy pattern with no signal transmission; or alternatively, the first lower circuit layer 112 may be served only as a dummy pattern with no signal transmission.

In an aforementioned embodiment, a conductive layer or a circuit layer may be a single-layer structure or a multi-layer structure. If the conductive layer or the circuit layer is a multi-layer structure, there is no insulating material or dielectric material disposed between the layers of the aforementioned multi-layer structure. Moreover, structurally, if the conductive layer or the circuit layer is a multi-layer structure, even if the layers of the aforementioned multi-layer structure are formed by different processes, it may be represented (but not limited to) by a same term and/or symbol.

In an aforementioned embodiment, an insulating layer or a dielectric layer may be a single-layer structure or a multi-layer structure. If the insulating layer or the dielectric layer is a multi-layer structure, there is no conductive material disposed between the layers of the aforementioned multi-layer structure. Moreover, structurally, if the insulating layer or the dielectric layer is a multi-layer structure, even if the layers of the aforementioned multi-layer structure are formed by different processes, it may be represented (but not limited to) by a same term and/or symbol.

In an aforementioned embodiment, a corresponding circuit in a circuit layer may be electrically connected to a corresponding circuit in another circuit layer through a corresponding conductive via. In other words, unless specifically stated or implied, even if an electrical connection between a corresponding circuit in a circuit layer and a corresponding circuit in another circuit layer is not shown in a drawing, the aforementioned corresponding circuit in the circuit layer and the aforementioned corresponding circuit in another circuit layer may be electrically connected to each other through the conductive via that are not shown in the drawing or on a cross-section not shown.

In summary, in the electronic packaging structure, the electronic device is disposed between the first circuit structure and the second circuit structure, and at least a portion of the electronic device may be disposed within the cavity of the first circuit structure. In this way, the electronic devices may have a better protection, which may reduce the possibility of damage or failure of the electronic device, and thus improve the quality of the electronic packaging structure.

Additionally, the first circuit structure of the electronic packaging structure may further include a coaxial conductive via. The electronic device may be electrically connected to a corresponding circuit (e.g., an antenna) through the coaxial conductive via (e.g., through the inner conductive layer of the coaxial conductive via). In this way, signal interference may be reduced and/or signal quality may be improved or better.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic packaging structure, comprising:
   a first circuit structure, having at least one cavity on a bottom side thereof;
   a second circuit structure, the first circuit structure being disposed thereon, wherein the first circuit structure and the second circuit structure are electrically connected to each other; and
   at least one electronic device, disposed on the second circuit structure, wherein the electronic device is disposed corresponding to the cavity of the first circuit structure, wherein the first circuit structure comprises at least one coaxial conductive through via, wherein the coaxial conductive through via comprises:
   an inner conductive layer;
   an outer conductive layer;
   a first dielectric layer, disposed between the inner conductive layer and the outer conductive layer
   a second dielectric layer, wherein the inner conductive layer is disposed between the first dielectric layer and the second dielectric layer.

2. The electronic packaging structure according to claim 1, wherein an inner surface of the cavity of the first circuit structure is covered with a conductive material.

3. The electronic packaging structure according to claim 2, wherein the conductive material covered on the inner surface of the cavity of the first circuit structure is electrically grounded.

4. The electronic packaging structure according to claim 1, wherein a material of the outer conductive layer of the coaxial conductive through via includes copper.

5. The electronic packaging structure according to claim 1, wherein a material of the first dielectric layer of the coaxial conductive through via includes resin.

6. The electronic packaging structure according to claim 1, wherein the first circuit structure further comprises:
   an upper conductive layer; and
   a lower conductive layer, wherein two ends of the outer conductive layer of the one coaxial conductive through via are respectively connected to a portion of the upper conductive layer and a portion of the lower conductive layer.

7. The electronic packaging structure according to claim 1, wherein the inner conductive layer of the coaxial conductive through via is electrically connected to outermost circuits on both sides of the first circuit structure.

8. The electronic packaging structure according to claim 1, wherein the first circuit structure further comprises:
   an antenna, being at least a portion of an outermost circuit layer of the first circuit structure,
   wherein the electronic device is electrically connected to the antenna through the inner conductive layer of the coaxial conductive through via,
   wherein an inner surface of the cavity of the first circuit structure is covered with a conductive material, and the conductive material covered on the inner surface of the cavity and the outer conductive layer of the coaxial conductive through via are electrically grounded.

9. The electronic packaging structure according to claim 1, wherein at least one of the first circuit structure or the second circuit structure comprises a solder resist layer disposed on an outermost thereof.

10. The electronic packaging structure according to claim 1, further comprising:
a filling material, disposed between the first circuit structure and the second circuit structure.

11. The electronic packaging structure according to claim 1, further comprising:
a conductive connector, disposed between the first circuit structure and the second circuit structure to electrically connect the first circuit structure and the second circuit structure.

12. The electronic packaging structure according to claim 1, further comprising:
a conductive connector, disposed between the electronic device and the second circuit structure to electrically connect the electronic device and the second circuit structure.

13. A manufacturing method of an electronic packaging structure, comprising:
providing a first circuit structure, having at least one cavity on a bottom side thereof;
providing a second circuit structure;
disposing at least one electronic device on the second circuit structure; and
disposing the first circuit structure on the second circuit structure with the electronic device disposed thereon, wherein the first circuit structure and the second circuit structure are electrically connected to each other, and the electronic device is disposed corresponding to the cavity of the first circuit structure, wherein the first circuit structure comprises at least one coaxial conductive through via, wherein the coaxial conductive through via comprises:
an inner conductive layer;
an outer conductive layer;
a first dielectric layer, disposed between the inner conductive layer and the outer conductive layer
a second dielectric layer, wherein the inner conductive layer is disposed between the first dielectric layer and the second dielectric layer.

14. An electronic packaging structure, comprising:
a first circuit structure, having at least one cavity on a bottom side thereof;
a second circuit structure, the first circuit structure being disposed thereon, wherein the first circuit structure and the second circuit structure are electrically connected to each other; and
at least one electronic device, disposed on the second circuit structure, wherein the electronic device is disposed corresponding to the cavity of the first circuit structure, wherein the first circuit structure comprises:
an antenna, being at least a portion of an outermost circuit layer of the first circuit structure; and
at least one coaxial conductive through via, wherein the coaxial conductive through via comprises:
an inner conductive layer;
an outer conductive layer; and
a first dielectric layer, disposed between the inner conductive layer and the outer conductive layer,
wherein the electronic device is electrically connected to the antenna through the inner conductive layer of the coaxial conductive through via, and
wherein an inner surface of the cavity of the first circuit structure is covered with a conductive material, and the conductive material covered on the inner surface of the cavity and the outer conductive layer of the coaxial conductive through via are electrically grounded.

15. The electronic packaging structure according to claim 14, wherein at least one of the first circuit structure or the second circuit structure comprises a solder resist layer disposed on an outermost thereof.

16. The electronic packaging structure according to claim 14, further comprising:
a filling material, disposed between the first circuit structure and the second circuit structure.

17. The electronic packaging structure according to claim 14, further comprising:
a conductive connector, disposed between the first circuit structure and the second circuit structure to electrically connect the first circuit structure and the second circuit structure.

18. The electronic packaging structure according to claim 14, further comprising:
a conductive connector, disposed between the electronic device and the second circuit structure to electrically connect the electronic device and the second circuit structure.

* * * * *